United States Patent
Hopkins et al.

(10) Patent No.: US 11,252,828 B2
(45) Date of Patent: Feb. 15, 2022

(54) HOUSING AND WALL MOUNT CASING FOR GOOGLE NEST GUARD OR SIMILAR ARTICLE

(71) Applicants: Geoffrey M. Hopkins, Syracuse, NY (US); Pamela S. Edwards, Syracuse, NY (US)

(72) Inventors: Geoffrey M. Hopkins, Syracuse, NY (US); Pamela S. Edwards, Syracuse, NY (US)

( * ) Notice: Subject to any disclaimer, the term of this patent is extended or adjusted under 35 U.S.C. 154(b) by 0 days.

(21) Appl. No.: 17/000,687

(22) Filed: Aug. 24, 2020

(65) Prior Publication Data
US 2021/0076516 A1    Mar. 11, 2021

Related U.S. Application Data

(60) Provisional application No. 62/896,323, filed on Sep. 5, 2019.

(51) Int. Cl.
*H05K 5/02*      (2006.01)
*G08B 13/00*    (2006.01)

(52) U.S. Cl.
CPC ......... *H05K 5/0204* (2013.01); *H05K 5/0247* (2013.01); *G08B 13/00* (2013.01)

(58) Field of Classification Search
None
See application file for complete search history.

(56) References Cited

U.S. PATENT DOCUMENTS

| | | | | |
|---|---|---|---|---|
| 6,367,180 B2* | 4/2002 | Weiss | ...... | G09F 13/04 40/544 |
| 7,012,544 B2* | 3/2006 | Cunningham | ...... | G09F 13/04 340/815.55 |
| 7,068,176 B2* | 6/2006 | Black | ...... | G08B 3/10 340/628 |
| 7,948,389 B2* | 5/2011 | Sharpe | ...... | G08B 29/181 340/628 |
| 8,015,873 B2* | 9/2011 | Hall | ...... | F24F 11/30 73/431 |
| 8,102,250 B2* | 1/2012 | Fleming | ...... | H04L 67/125 340/517 |
| 8,254,095 B2* | 8/2012 | Carey | ...... | G08B 7/06 361/679.01 |
| 8,433,281 B1* | 4/2013 | Blum | ...... | H04W 4/90 455/404.1 |
| 8,436,731 B2* | 5/2013 | Davis | ...... | G08B 13/1436 340/540 |
| 8,910,820 B2* | 12/2014 | Sharpe | ...... | G08B 17/113 220/481 |
| 9,070,272 B2* | 6/2015 | Gettings | ...... | G08B 3/10 |
| 9,520,252 B2 | 12/2016 | Mittleman et al. | | |
| 9,581,342 B2 | 2/2017 | Daniels et al. | | |

(Continued)

*Primary Examiner* — Xanthia C Cunningham
(74) *Attorney, Agent, or Firm* — Bernhard P. Molldrem, Jr.

(57) ABSTRACT

A table-top or wall-mount case houses a control box unit for a home security system. A main housing component seats the control box, and a lid or cap fits into (or onto) the main component and holds the control box in place. A circular opening or window in the cap provides access to the keys or buttons of the key pad. A ring of a plastic foam or other yielding resilient material retains the control unit and holds it in position inside the case. A cord opening and a channel or groove are provided in the base for the power or data cord.

12 Claims, 4 Drawing Sheets

(56) References Cited

U.S. PATENT DOCUMENTS

| | | | | |
|---|---|---|---|---|
| D780,612 S * | 3/2017 | Alexander | | D10/102 |
| 9,890,970 B2 | 2/2018 | Bruck et al. | | |
| 10,211,567 B1 | 2/2019 | Glahe | | |
| 10,289,152 B1 | 5/2019 | Cheng et al. | | |
| 10,311,870 B2 | 6/2019 | Tuli | | |
| 10,326,921 B2 * | 6/2019 | Chien | | G01J 5/089 |
| 10,386,704 B2 | 8/2019 | Wengreen | | |
| 10,732,051 B2 * | 8/2020 | Zhang | | G01J 5/0831 |
| 11,042,829 B2 * | 6/2021 | Komoni | | G06Q 10/0833 |
| 2007/0126576 A1 * | 6/2007 | Script | | G08B 13/08 |
| | | | | 340/545.5 |
| 2008/0036595 A1 * | 2/2008 | Hollstien | | G08B 13/1436 |
| | | | | 340/541 |
| 2009/0073694 A1 * | 3/2009 | Scannell, Jr. | | A47G 7/06 |
| | | | | 362/253 |
| 2009/0079349 A1 * | 3/2009 | Sibalich | | F21S 8/02 |
| | | | | 315/155 |
| 2009/0281497 A1 * | 11/2009 | Kamen | | A61M 5/14244 |
| | | | | 604/151 |
| 2010/0073172 A1 * | 3/2010 | Lax | | G08B 17/10 |
| | | | | 340/578 |
| 2013/0099124 A1 * | 4/2013 | Filson | | G06F 3/0487 |
| | | | | 250/349 |
| 2014/0324232 A1 * | 10/2014 | Modi | | G05D 23/1931 |
| | | | | 700/278 |
| 2015/0070190 A1 * | 3/2015 | Wai Fong | | G01J 1/4204 |
| | | | | 340/870.3 |
| 2015/0248833 A1 * | 9/2015 | Arne | | G08C 17/02 |
| | | | | 340/870.07 |
| 2016/0013560 A1 * | 1/2016 | Daniels | | H01Q 1/243 |
| | | | | 343/700 MS |
| 2016/0334076 A1 * | 11/2016 | Dong | | G05G 1/105 |
| 2017/0097259 A1 * | 4/2017 | Brown | | G01J 1/4228 |
| 2017/0162028 A1 * | 6/2017 | Kramer | | G08B 21/182 |
| 2017/0295658 A1 * | 10/2017 | Whitmire | | H05K 5/0221 |
| 2018/0077391 A1 * | 3/2018 | Siminoff | | H04N 5/2252 |
| 2018/0357871 A1 * | 12/2018 | Siminoff | | G08B 3/10 |
| 2019/0003196 A1 | 1/2019 | Hall et al. | | |
| 2019/0249904 A1 * | 8/2019 | Mahal | | F24S 60/10 |
| 2019/0347925 A1 * | 11/2019 | Faltaous | | G08B 25/08 |
| 2020/0163237 A1 * | 5/2020 | Kozlowski | | H02G 3/14 |
| 2020/0291714 A1 * | 9/2020 | Baer | | E05F 15/73 |

* cited by examiner

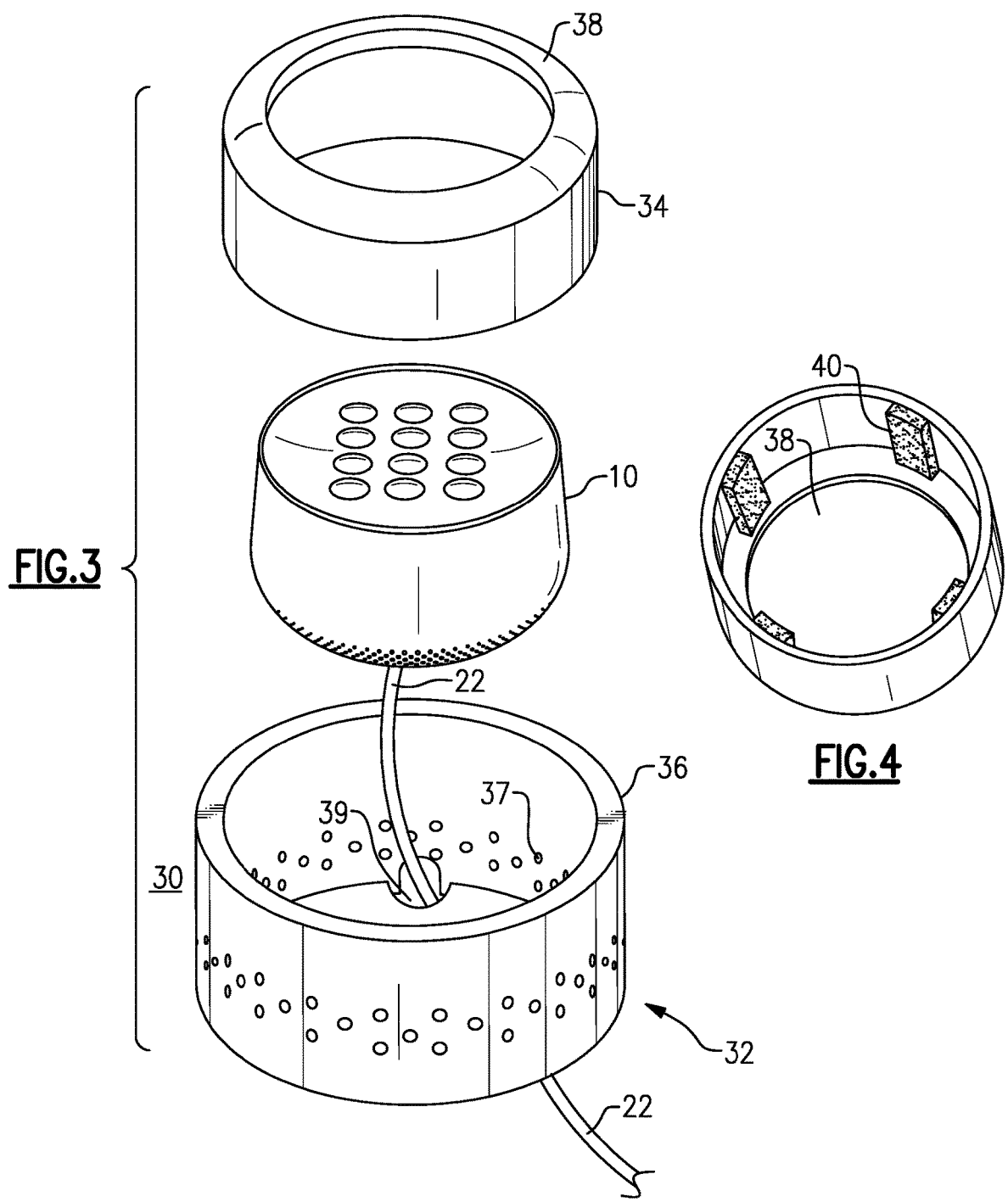

HOUSING AND WALL MOUNT CASING FOR GOOGLE NEST GUARD OR SIMILAR ARTICLE

Applicants claim priority under 35 U.S.C. 119(e) of Provisional U.S. Patent Application Ser. No. 62/896,323, filed Sep. 5, 2019, the disclosure whereof is incorporated by reference herein.

BACKGROUND OF THE INVENTION

The invention concerns a housing for a control box unit that has been intended to rest on a flat surface, e.g., table top, and intended e.g. for a home security system. Because the control box unit needs to be located at an entry to a home, it is often advantageous to be able to mount it on a wall near the interior of the doorway. However, the control unit has no provision for wall mounting, and the power cord for it comes out the back of the unit, which would be the top if it were mounted vertically on a wall, although it would be preferable to locate the power cord at the bottom as any available wall outlet is typically at the lower part of the wall near the floor molding. Also, even if the control box were kept on a horizontal surface, it is advantageous to protect it from damage from being knocked accidentally off the table and onto the floor. There is also a need to allow for audible announcements and voice commands if a housing is provided for the unit. One example of the control box is the Nest Guard as marketed by Google.

OBJECTS AND SUMMARY OF THE INVENTION

It is an object of our invention to provide a straightforward, simple to install housing for the control box or control unit of this type, that will permit the unit to be wall-mounted or mounted on any vertical surface.

It is another object to provide a housing that provides protection from shocks and drops whether the unit is wall mounted or placed on a shelf or table.

A further object is to provide a housing that is simple to install on or over the control box without special tools.

A still further object is to provide a housing that permits ventilation between the control box and the ambient, and which does not interfere with audible messages and commands.

In accordance with an aspect of this invention, a housing is provided and designed to accommodate the control box unit. In the example or embodiment described below, the design is for a particular housing specific to one current model of the Google Nest Guard, which is of a round configuration. That design or shape may vary in order to accommodate model changes in the Guard product, or to accommodate control box designs from other sources.

In the described embodiment the housing accommodates a current model of Nest Guard, which is generally cylindrical or frustoconic, with a flat top and slightly bulging base. Here, the housing has a base member formed as a cylinder of a tough plastic, e.g., PVC with one closed end that becomes the base when on a table and back when wall-mounted, and with perforations on the side wall near the bottom or back to allow for ventilation and to permit sound to pass through. There are also openings for mounting screws. An opening is provided at the back (or at the top when wall-mounted) for the power cord, and favorably a channel on either the interior or exterior of the flat back or bottom extends across the diameter of the base member, so the cord can extend from the lower end when wall-mounted.

A round cap member fits into the open side of the base member, and can be retained by spiral threads or by friction over the Nest Guard. There is a round, on-center opening on the front or top of the round cap, dimensioned so that its circular inner edge is just slightly smaller than the diameter of the top or front of the Guard, so the key pad and other visible features are available. In alternative embodiments, the cap member can be unitary with the top of the base member, and the back or bottom can be a removably installed disk. In that case, the control unit can be installed through the open bottom or back of the housing, and secured in place by fastening in the bottom disk.

In this example padding or packing is fitted into the upper part of the inside of the cap member. The packing may be a foam strip or multiple foam strips, which hold the upper part of the Nest Guard securely centered in the housing. These also provide some cushioning protection from shock or dropping. Other flexible structure can be provided in place of the foam strip(s), e.g., an array of flexible fingers or fins.

The base or reverse side of the housing can be secured to the wall by screws, or in many cases with double-sided tape or other adhesive.

The invention can best be explained with an illustrated preferred embodiment, as disclosed in the following Description when taken in conjunction with the accompanying Drawing Figures.

DESCRIPTION OF THE DRAWING FIGURES

FIG. 3 is an assembly view showing the base member and cap member or lid of the housing, together with the control box FIG. 4 is a perspective view showing the lower and inner portions of the cap member or lid.

DESCRIPTION OF A PREFERRED EMBODIMENT

Figure 1:
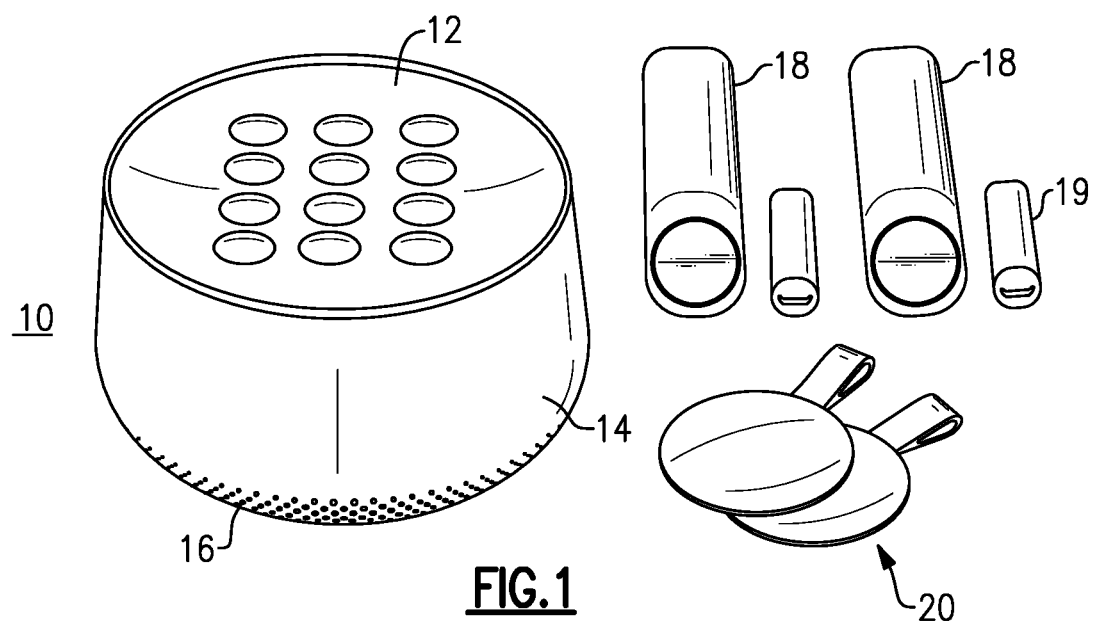
FIG. 1 is a perspective view of a Nest Guard control box arrangement, together with accessory security devices that are to be wirelessly connected with the Nest Guard unit.

With reference to the Drawing Figures, and initially to FIG. 1, a security system wireless control box unit 10 is shown with a twelve-button key pad 12 at its upper side, a shell 14 of a rigid material formed in a round shape with a slightly wider base than at the top surface, and an array of perforations 16, for purposes of ventilation and sound transmission/reception, at the lower part of the round sidewall. Here the control box unit 10 is a Google Hub Guard, and has a cylindrical to somewhat frustoconic shape, with a slightly bulged-out bottom side. This is a convenient example, but our invention can be applied to control boxes of a wide variety of geometries. A cord 22 is obscured in this view but extends from the back of the control box unit 10. To the right of the generally cylindrical or frustoconic control box unit 10 are accessory security devices, e.g., motion detectors 18, door and window sensors 19, and key fobs 20 for authorized persons. These may connect via Wi-Fi or Bluetooth, or other wireless means with other equipment including the unit 10.

Figure 2:
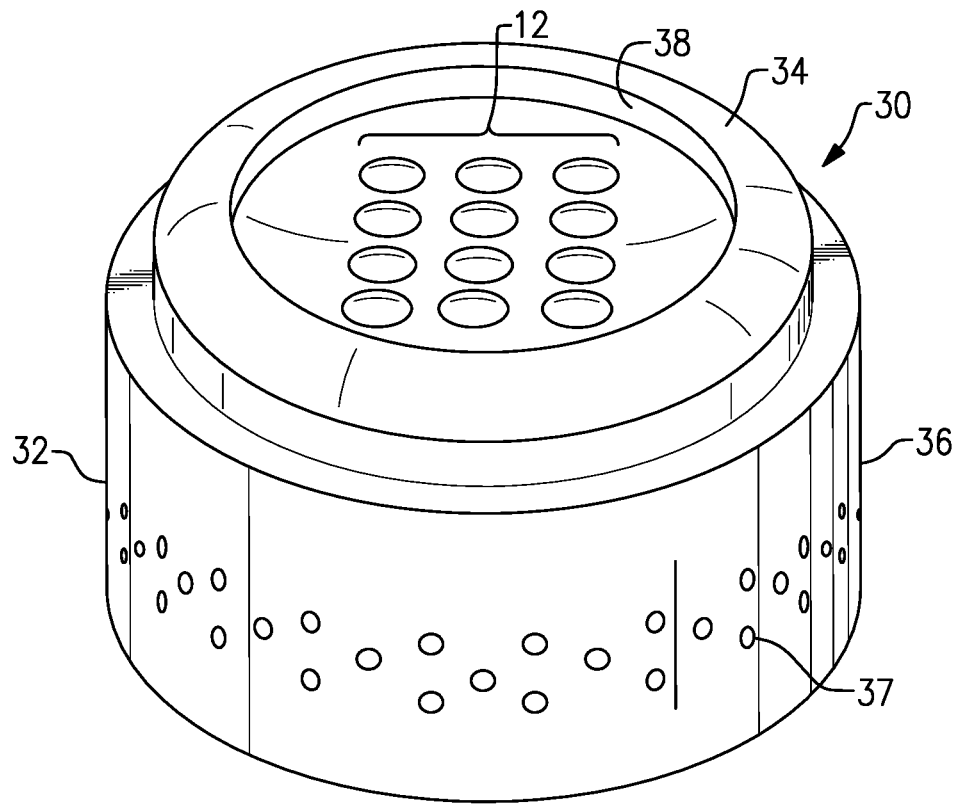
FIG. 2 is a perspective of the Nest Guard of FIG. 1 contained in a housing or wall-mount casing according to one embodiment of the invention.

FIG. 2 shows an example of our case or wall-mount housing 30, here holding the control box unit 10, and comprising a lower or back main housing component 32 and a lid or cap 34 that fits into (or onto) the lower component 32 and also fits over the unit 10 to hold it in place. The cap has a circular opening or window 38 to provide access to the keys or buttons of the key pad 12. Here, the diameter of the opening 38 of cap portion 34 is slightly smaller than the top of the shell 14 of the control unit 10. The main housing component 32 has a generally cylindrical wall 36 with perforations 37 around its lower periphery to permit ventilation and sound transmission. Favorably, a ring of a plastic foam or other yielding resilient material, discussed below, may be present inside the upper part of the cap portion 34 to serve as means for retaining the control unit 10 and keeping it held at a steady position inside the case or housing 30. Other equivalent retaining means are available and could be used instead. In this embodiment, the window 38 is open, but in other embodiments there may be a clear membrane at the opening that allows touch-access to the key pad 12 or other user interface provided on the control unit.

FIG. 3 is a more detailed assembly view, showing the control unit 10 about to be positioned inside the base or main housing component 32. This view also shows the power cord 22, which may extend to a not-shown re-charger or other power supply, here passing through an opening 39 in the main housing component. In some possible implementations this cord 22 may be a data communications cable, or an Ethernet cable. When the unit 10 has been placed inside the base or main component, the lid component 34 holds the control unit snugly in place. FIG. 4 shows the lid component 34 inverted, with the foam plastic ring 40 on the inside wall of the lid component adjacent the top thereof at the rim of the round opening 38. The ring 40 may be of one or more strips of foam tape, or may be another material adhered or fastened to the lid component. For example, some embodiments may employ a ring of resilient fins to hold the unit 10 snugly in place. Returning to FIG. 3, the perforations 37 in the wall 36 of the main component 32 are more-or-less aligned with the perforations 16 in the control unit 10, and permit air flow and sound travel to and from the unit 10, which facilitates receiving of user voice commands and transmission of audible reports and information from the unit.

Figure 5:
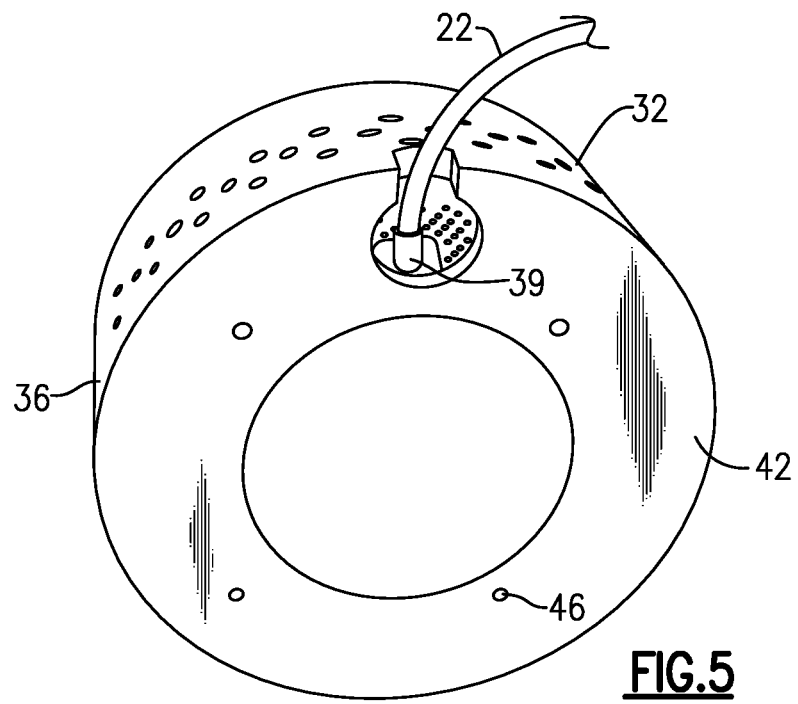
FIG. 5 is a perspective view showing the back or base side of the housing or wall-mount casing of this embodiment.
Figure 6:
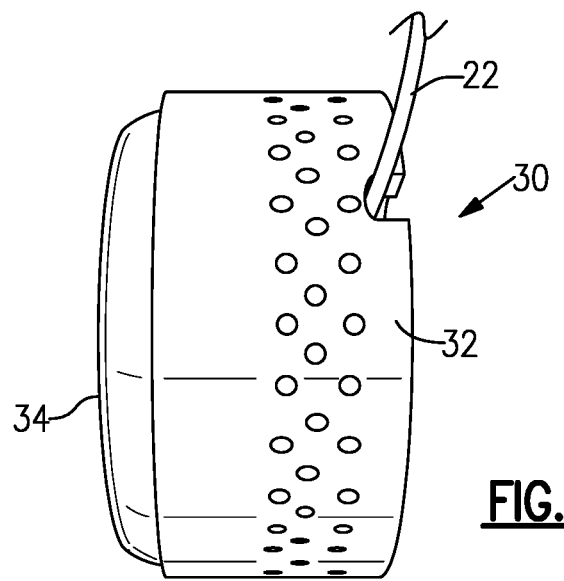
FIG. 6 is a side elevation thereof.

FIGS. 5 and 6 are a rear view (if the casing 30 is wall-mounted) or bottom view (if placed horizontally on a table or shelf), and a side view (where wall-mounted), respectively. These show the main unit 32 as having a round, flat base wall 42, and the opening 39 for the power cord formed at one edge where the base wall 42 meets the cylindrical side wall 36. In the embodiment as shown here, the opening 39 for cord 22 is at the rear in a horizontal table placement, but would then be at the top if the unit is wall-mounted. If it is desired to run the cord 22 downward, e.g., from the lower side of the casing or housing when wall-mounted, a means for passing the cord 22 downward may be formed in the wall 42 and one example is discussed below in reference to FIG. 8. As also shown here, there may be holes 46 formed in the back wall to permit the use of screws or other fasteners to attach the base main component 32 to the wall. Or if preferred, a double-sided adhesive tape or similar material may be used for attaching the main component 32 to the wall.

Figure 7:
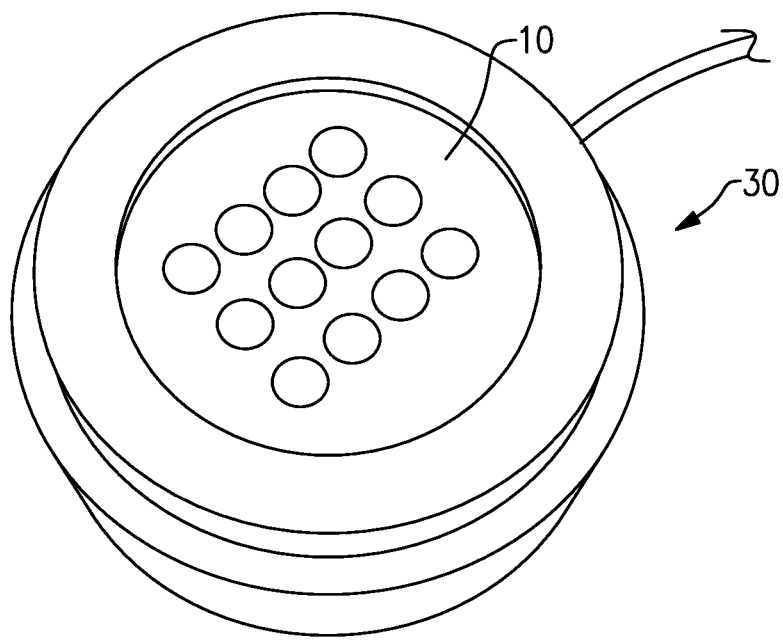
FIG. 7 is a top view of the housing or wall-mount casing with the control box unit contained inside and with illuminated portions thereof lit.

FIG. 7 shows the control unit 10 and wall-mount casing or housing 30 as they might appear when mounted on a wall. Here the key pad 12 is shown surrounded with visible indicators which may light up to guide the user in controlling the associated home security system, as well as conducting other functions. As a component of the user's home-based IoT, the unit 10 may also be used for locking and unlocking doors, turning lights on and off, or controlling temperature set-points of an associated thermostat. The design of the casing or housing does not interfere with any of those functions, which may be controlled either by pressing on the keypad 12 or by voice commands. Gestural commands may be possible in the near future.

Figure 8:
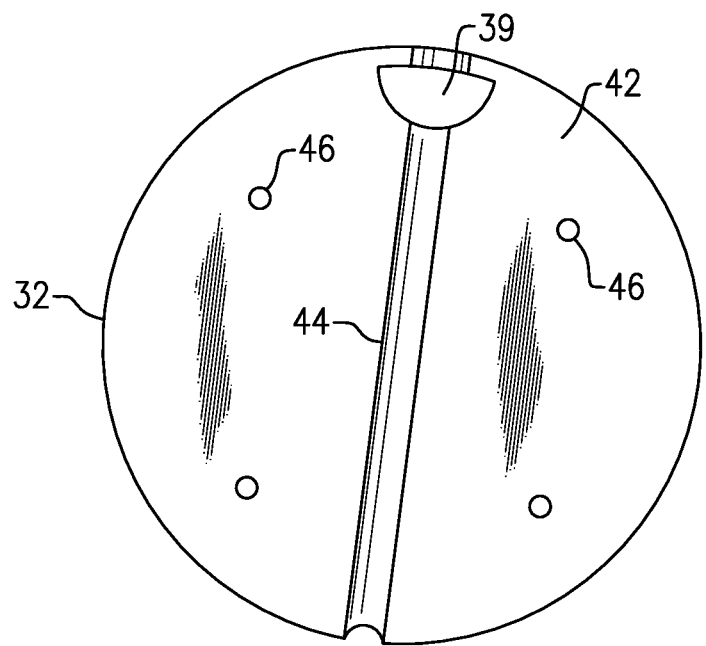
FIG. 8 is a view of the back or base of the housing or wall-mount casing with a channel for the power cord extending from top to bottom thereof.

FIG. 8 shows the rear or base wall 42 of the main housing component 32, with a channel or vertical cutout 44 extending from the cord opening 39 at the top down to the bottom of the base wall 42. This permits the power cord 22 (not shown here) to extend down from the housing to an available wall outlet below the position of the housing 30 and control unit 10. Alternatively, the base wall could have a tunnel or channel elsewhere, either on the back or on the inside, as a matter of design choice.

FIG. 8 also shows the position of four screw holes 46 for attachment to a wall. There could be more or fewer holes, or other structure provided to permit the casing or housing 30 to attach to a vertical surface.

In this embodiment, the components 32 and 34 are formed of a tough, durable, rigid plastic resin, such as PVC, although a wide variety of materials could be used, including composites. Also, the housing or casing 30 may be of other shapes and geometries as a matter of product design or to accommodate control units of any of a variety of shapes. The cap 34 may be made of a more flexible plastic resin material than the main or base component 32, and may have ridges or fingers around the opening 38 in place of the foam tape ring. In some possible embodiments, the cap may fit around, rather than into, the main base component, or may snap into place using available attachment techniques. As an alternative construction, the cap 34 may be fused onto the cylindrical side wall 36 or formed unitarily with it, and with the base wall 42 may be a separate piece which can be twisted or clamped in place. In that arrangement, the control box unit 10 would be installed through the opening in the base side of the main housing component, and then the base wall secured in place. In other variations, the side wall 36 may be split and hinged or clamped, so that the control unit may be inserted through the side.

Moreover, as control units 10 for different systems may have any of a variety of geometrical shapes, the shape and geometry of the case or wall-mount housing 30 can have a shape and geometry suited to the particular control unit. For example, a magnetic back or base may be employed for placing the unit onto steel or other ferromagnetic vertical surfaces. In other embodiments, the base or back ma be adapted to use one or more adhesive strips employing a repositionable pressure-sensitive adhesive e.g. as in U.S. Pat. No. 5,086,946 or 5,939,161. The main base component may be configured to snap in place onto the control box, and to adhere to the vertical surface with double-sided adhesive strips.

Many other embodiments and variations of the aforedescribed case and/or wall-mount housing are possible without departing from the scope and spirit of this invention, to be measured by the appended Claims.

We claim:

1. A housing for containing and protecting a control unit for a home security system, wherein the control unit includes a shell that contains data handling and transmission mechanism, the shell having a predetermined shape, the shell also having a top portion containing a user interface;

the housing comprising:

a base wall configured for attachment to a wall or similar vertical surface and also configured to lie upon a horizontal surface;

a side wall configured to form a cavity to accommodate and enclose the shell of said control unit, with at least a portion of said side wall having been treated or configured to permit sound and ventilation therethrough; and a cap portion positioned on said side wall opposite said base wall;

with one of said side wall and cap portion being configured to form a snug fit onto said control unit within said cavity; and said cap portion having a window opening formed therein aligned with the user interface on the top portion of said shell and configured to provide user touch access through said window opening to said user interface, and wherein said window opening is of smaller diameter than the top portion of the shell of said control unit.

2. A housing for a control unit for a home security system according to claim 1, wherein said base wall has a top portion and a bottom portion, considered when the base wall is attached to a wall or similar vertical surface; and comprising a power cord opening through said top portion and a channel groove therein extending transversely from said top portion to said bottom portion, said channel groove being configured to accommodate said power cord when the base wall is attached to said wall or similar vertical surface so that the power cord exits downward from the bottom portion of said base wall.

3. A housing for a control unit for a home security system according to claim 1, wherein said base wall is removably fastened to said side wall at a base opening in the sidewall, and said housing is configured to receive the control unit through said base opening.

4. A housing for a control unit for a home security system according to claim 1, wherein said side wall has a proximal opening at a proximal end thereof to receive said control unit and said cap portion is configured to fit into or onto said side wall over said front opening.

5. A housing for a control unit for a home security system, wherein the control unit includes a shell that contains therewithin data handling and transmission mechanisms, and the shell having a predetermined shape, the shell also having a top portion containing a user touch interface; the housing comprising a main portion having a base wall suited for attachment to a wall or similar vertical surface, a side wall configured to contain and accommodate the shell of said control unit, with the side wall of the main portion having been treated or configured to permit sound transmission and ventilation therethrough, and a cap portion that fits into or onto said main portion and forms a snug fit over said control unit and within an upper or forward end of the side wall of said main portion, and the cap portion having a window opening formed therein to permit user touch access through said window opening to said user interface and wherein said window opening is of smaller diameter than the top portion of the shell of said control unit.

6. The housing for a control unit according to claim 5, wherein said control unit is generally of a cylindrical or frustoconic shape with a base that bulges to be wider than the top or front thereof, and wherein said lower portion side wall is of a cylindrical form, and wherein said cap portion has generally cylindrical geometry to fit snugly into the cylindrical-form side wall of the main portion.

7. The housing for a control unit according to claim 6, wherein said cap portion includes a ring of a resilient material on an inner surface of the cylindrical-form side wall thereof.

8. The housing for a control unit according to claim 5, wherein the side wall of the main portion has a plurality of perforations therein configured for permitting sound and ventilation to pass through.

9. The housing for a control unit according to claim 5, wherein said window formed in said cap portion includes a round opening of smaller diameter than the top portion of said shell.

10. The housing for a control unit according to claim 5, wherein said housing is formed of a rigid or semi-rigid plastic resin.

11. The housing for a control unit according to claim 7, wherein said resilient material includes a plastic foam material.

12. The housing for a control unit according to claim 5, wherein said base wall has a top portion and a bottom portion, considered when the base wall is attached to a room wall or similar vertical surface; and comprising a power cord opening therethrough in said top portion and a channel groove therein extending transversely from said top portion to said bottom portion and configured to accommodate said power cord so that the latter exits downward from said bottom portion.

* * * * *